US012740081B2

(12) United States Patent
Hao et al.

(10) Patent No.: US 12,740,081 B2
(45) Date of Patent: Sep. 15, 2026

(54) NITRIDE-BASED SEMICONDUCTOR DEVICE AND METHOD FOR MANUFACTURING THE SAME

(71) Applicant: INNOSCIENCE (SUZHOU) TECHNOLOGY CO., LTD., Suzhou City (CN)

(72) Inventors: Ronghui Hao, Suzhou City (CN); Jinhan Zhang, Suzhou City (CN); King Yuen Wong, Suzhou City (CN)

(73) Assignee: INNOSCIENCE (SUZHOU) TECHNOLOGY CO., LTD., Suzhou City (CN)

( * ) Notice: Subject to any disclaimer, the term of this patent is extended or adjusted under 35 U.S.C. 154(b) by 1347 days.

(21) Appl. No.: 17/609,417

(22) PCT Filed: Sep. 28, 2021

(86) PCT No.: PCT/CN2021/121417
§ 371 (c)(1),
(2) Date: Nov. 8, 2021

(87) PCT Pub. No.: WO2023/050085
PCT Pub. Date: Apr. 6, 2023

(65) Prior Publication Data
US 2024/0030309 A1 Jan. 25, 2024

(51) Int. Cl.
*H10D 30/47* (2025.01)
*H10D 30/01* (2025.01)
(Continued)

(52) U.S. Cl.
CPC ......... *H10D 30/015* (2025.01); *H10D 30/475* (2025.01); *H10D 62/343* (2025.01); *H10D 62/8503* (2025.01); *H10D 64/112* (2025.01)

(58) Field of Classification Search
CPC ... H10D 30/111; H10D 30/112; H10D 30/475
See application file for complete search history.

(56) References Cited

U.S. PATENT DOCUMENTS 10,833,159 B1 * 11/2020 Hao .................. H10D 30/4732
11,049,799 B1 * 6/2021 Lin ........................ H10D 30/47
(Continued)

FOREIGN PATENT DOCUMENTS

CN 101107713 A 1/2008
CN 102148157 A 8/2011
(Continued)

OTHER PUBLICATIONS

International Search Report and Written Opinion of the corresponding PCT application No. PCT/CN2021/121417 mailed on Jun. 29, 2022.

(Continued)

*Primary Examiner* — Matthew C Landau
(74) *Attorney, Agent, or Firm* — Li & Cai Intellectual Property (USA) Office

(57) ABSTRACT

A nitride-based semiconductor device includes a first and a second nitride-based semiconductor layers, a source, a drain and a gate electrode, a doped nitride-based semiconductor layer, and a first field plate. The first field plate disposed over the doped nitride-based semiconductor layer. A vertical projection of the doped nitride-based semiconductor layer on the second nitride-based semiconductor layer overlaps with a vertical projection of the first field plate on the second nitride-based semiconductor layer, and a vertical projection of the gate electrode on the second nitride-based semiconductor layer is physically separated from the vertical projection of the first field plate on the second nitride-based semiconductor layer.

15 Claims, 12 Drawing Sheets

(51) Int. Cl.

| | |
|---|---|
| ***H10D 62/17*** | (2025.01) |
| ***H10D 62/85*** | (2025.01) |
| ***H10D 64/00*** | (2025.01) |

(56) References Cited

U.S. PATENT DOCUMENTS

| | | | | |
|---|---|---|---|---|
| 2016/0035847 | A1* | 2/2016 | Cao | H01L 21/283 438/172 |
| 2018/0204916 | A1 | 7/2018 | Shimizu et al. | |
| 2020/0273977 | A1 | 8/2020 | Cao et al. | |
| 2021/0167202 | A1* | 6/2021 | Lu | H10D 30/66 |

FOREIGN PATENT DOCUMENTS

| | | | |
|---|---|---|---|
| CN | 102790086 | A | 11/2012 |
| CN | 103022121 | A | 4/2013 |
| CN | 102388441 | B | 5/2014 |
| CN | 106684140 | A | 5/2017 |
| CN | 112204753 | A | 1/2021 |
| CN | 112951909 | A | 6/2021 |

OTHER PUBLICATIONS

China Patent Office, Office action issued on Jun. 1, 2023.

* cited by examiner

NITRIDE-BASED SEMICONDUCTOR DEVICE AND METHOD FOR MANUFACTURING THE SAME

FIELD OF THE DISCLOSURE

The present invention generally relates to a nitride-based semiconductor device. More specifically, the present invention relates to a III-nitride-based semiconductor device having a p-type doped nitride-based semiconductor layer to constitute a reduced surface field structure.

BACKGROUND

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

In the nitride-based devices, how to reduce/alleviate the breakdown phenomenon induced by a strong peak electric field near a gate edge has become an important issue. When the device is operated under a high voltage condition, the breakdown phenomenon easily occurs, thereby deteriorating the electrical properties and the reliability. Thus, the applications of the nitride-based devices are limited.

SUMMARY OF THE DISCLOSURE

In accordance with one aspect of the present disclosure, a nitride-based semiconductor device is provided. The nitride-based semiconductor device includes a first nitride-based semiconductor layer, a second nitride-based semiconductor layer, a source electrode, a drain electrode, a gate electrode, a doped nitride-based semiconductor layer, and a first field plate. The second nitride-based semiconductor layer is disposed on the first nitride-based semiconductor layer and has a bandgap higher than a bandgap of the first nitride-based semiconductor layer. The source electrode and the drain electrode are disposed above the second nitride-based semiconductor layer. The gate electrode is disposed above the second nitride-based semiconductor layer and between the source and drain electrodes. The doped nitride-based semiconductor layer is disposed between the second nitride-based semiconductor layer and the gate electrode. The first field plate disposed over the doped nitride-based semiconductor layer. A vertical projection of the doped nitride-based semiconductor layer on the second nitride-based semiconductor layer overlaps with a vertical projection of the first field plate on the second nitride-based semiconductor layer, and a vertical projection of the gate electrode on the second nitride-based semiconductor layer is physically separated from the vertical projection of the first field plate on the second nitride-based semiconductor layer.

In accordance with one aspect of the present disclosure, a method for manufacturing a semiconductor device is provided. The method includes steps as follows. A first nitride-based semiconductor layer is formed over a substrate. A second nitride-based semiconductor layer is formed on the first nitride-based semiconductor layer. A blanket doped nitride-based semiconductor layer is formed over the second nitride-based semiconductor layer. A gate electrode is formed over the blanket doped nitride-based semiconductor layer. The blanket doped nitride-based semiconductor layer is patterned by using the gate electrode so as to form a doped nitride-based semiconductor layer wider than the gate electrode. A field plate is formed over the doped nitride-based semiconductor layer and the gate electrode, such that a vertical projection of the doped nitride-based semiconductor layer on the second nitride-based semiconductor layer overlaps with a vertical projection of the field plate on the second nitride-based semiconductor layer, and such that a vertical projection of the gate electrode on the second nitride-based semiconductor layer is physically separated from the vertical projection of the field plate on the second nitride-based semiconductor layer.

In accordance with one aspect of the present disclosure, a nitride-based is provided. A nitride-based semiconductor device includes a first nitride-based semiconductor layer, a second nitride-based semiconductor layer, a source electrode, a drain electrode, a gate electrode, a doped nitride-based semiconductor layer, a field plate, and a dielectric layer. The second nitride-based semiconductor layer is disposed on the first nitride-based semiconductor layer and has a bandgap higher than a bandgap of the first nitride-based semiconductor layer. The source electrode and the drain electrode are disposed above the second nitride-based semiconductor layer. The gate electrode is disposed above the second nitride-based semiconductor layer and between the source and drain electrodes. The doped nitride-based semiconductor layer is disposed between the second nitride-based semiconductor layer and the gate electrode and has a portion that extends toward the drain electrode. The field plate is disposed over the doped nitride-based semiconductor layer. The portion of the doped nitride-based semiconductor layer extends underneath the field plate. The dielectric layer is disposed between the second nitride-based semiconductor layer and the field plate and covers a surface of the portion of the doped nitride-based semiconductor layer.

Based on the above description, the doped nitride-based semiconductor layer has a protruding portion out of the gate electrode and overlapping with a portion of the field plate, such that the doped nitride-based semiconductor layer can modulate the electric field in the device with the field plate collaboratively. An improved electric field distribution can be achieved. As such, the semiconductor device can have good electrical properties and reliability.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

Figure 1A:
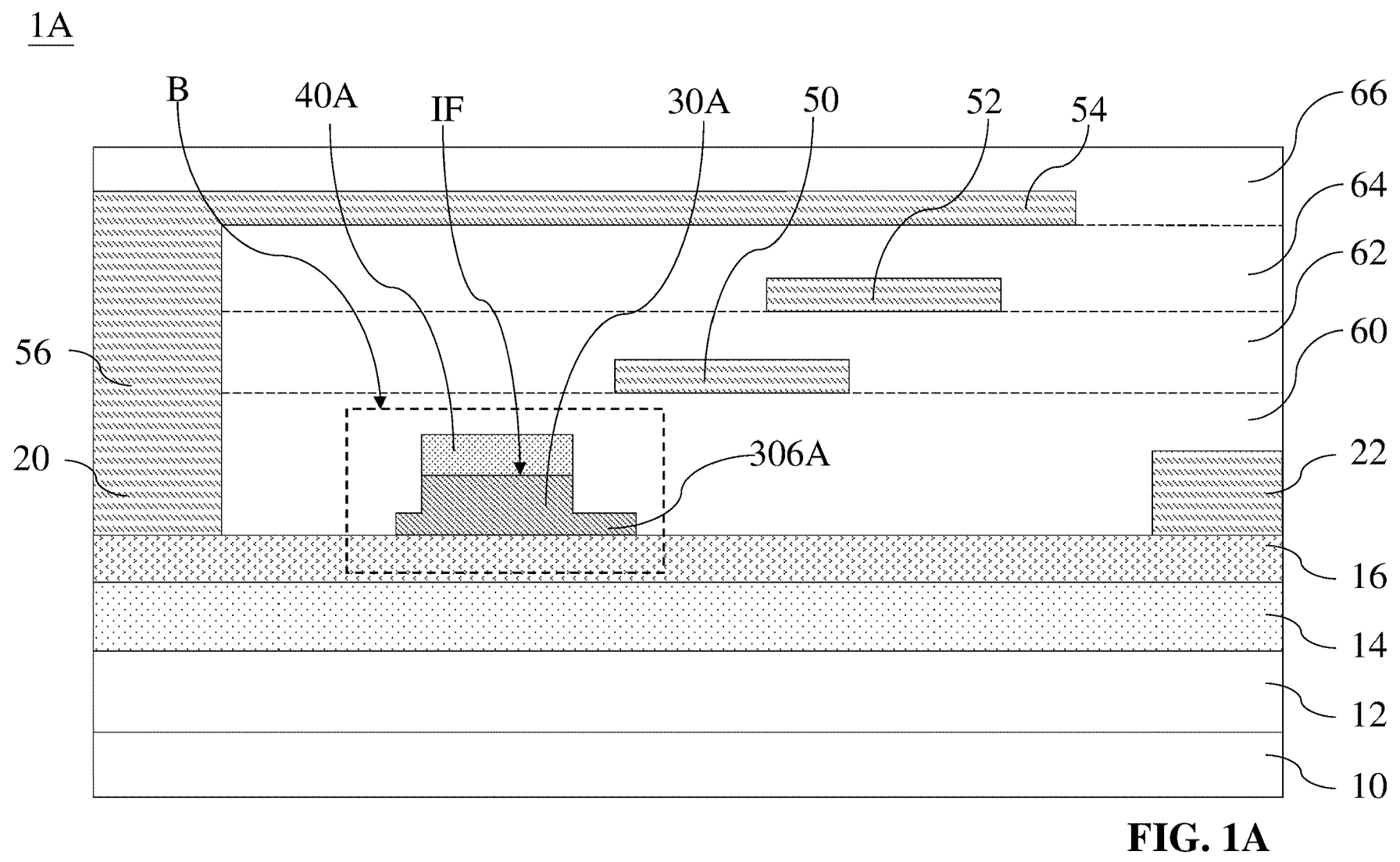

FIG. 1A is a vertical cross-sectional view of a semiconductor device according to some embodiments of the present disclosure;

DETAILED DESCRIPTION

Figure 1B:
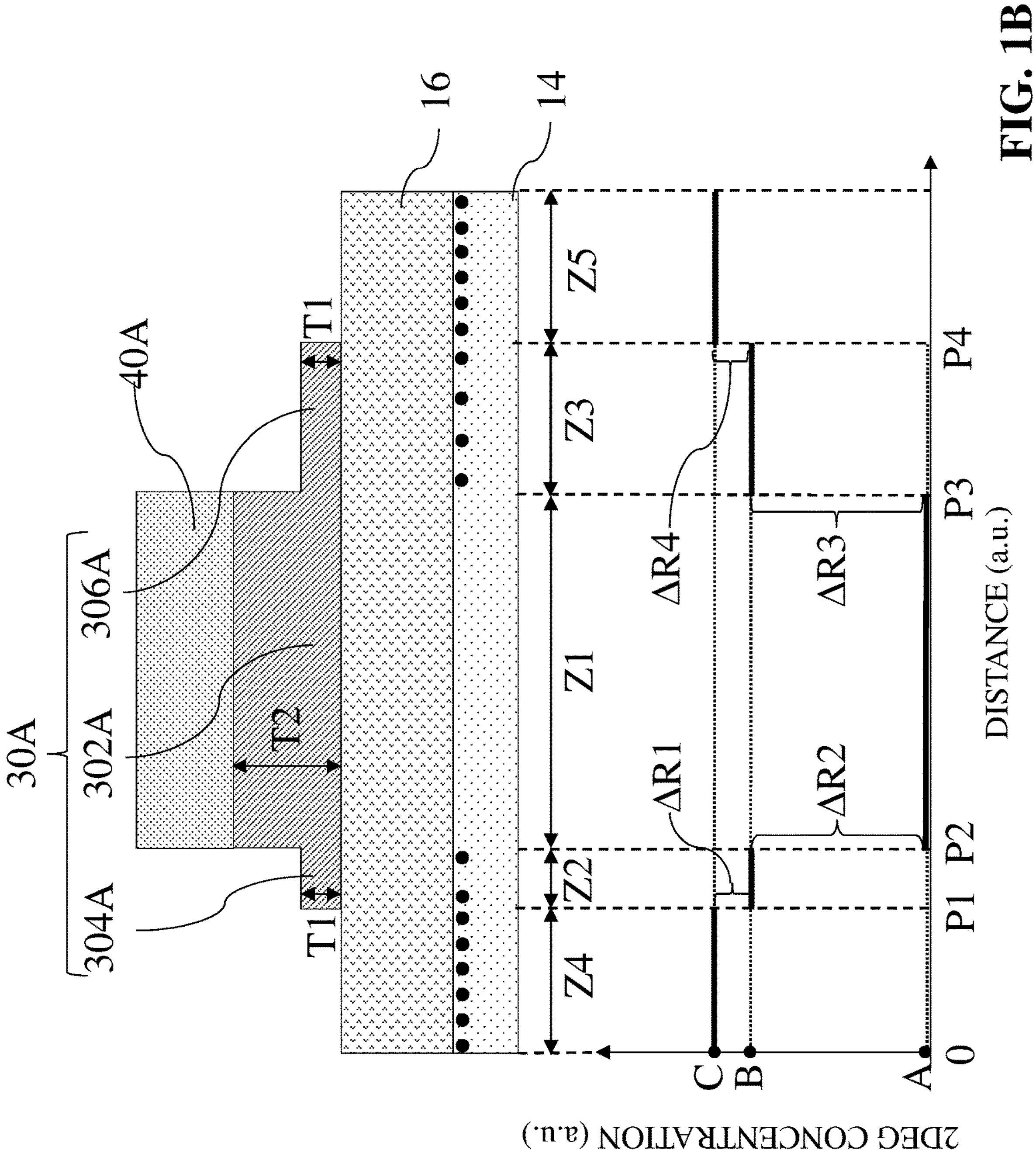
FIG. 1B is an enlarged vertical cross-sectional view of a region in FIG. 1A.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "on," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1A is a vertical cross-sectional view of a semiconductor device 1A according to some embodiments of the present disclosure. The semiconductor device 1A includes a substrate 10, a buffer layer 12, nitride-based semiconductor layers 14 and 16, electrodes 20 and 22, a doped nitride-based semiconductor layer 30A, a gate electrode 40A, field plates 50, 52, and 54, a connection portion 56, and dielectric layers 60, 62, 64 and 66.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof.

The buffer layer 12 can be disposed on/over/above the substrate 10. The buffer layer 12 can be disposed between the substrate 10 and the nitride-based semiconductor layer 14. The buffer layer 12 can be configured to reduce lattice and thermal mismatches between the substrate and the nitride-based semiconductor layer 14, thereby curing defects due to the mismatches/difference. The buffer layer 12 may include a III-V compound. The III-V compound can include, for example but are not limited to, aluminum, gallium, indium, nitrogen, or combinations thereof.

Accordingly, the exemplary materials of the buffer layer 12 can further include, for example but are not limited to, GaN, AlN, AlGaN, InAlGaN, or combinations thereof.

In some embodiments, the semiconductor device 1A may further include a nucleation layer (not shown). The nucleation layer may be formed between the substrate 10 and the buffer layer 12. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

The nitride-based semiconductor layer 14 is disposed on/over/above the buffer layer 12. The nitride-based semiconductor layer 16 is disposed on/over/above the nitride-based semiconductor layer 14. The exemplary materials of the nitride-based semiconductor layer 14 can include, for example but are not limited to, nitrides or group III-V compounds, such as GaN, AlN, InN, $In_xAl_yGa_{(1-x-y)}N$ where $x+y\leq1$, $Al_xGa_{(1-x)}N$ where $x\leq1$. The exemplary materials of the nitride-based semiconductor layer 16 can include, for example but are not limited to, nitrides or group III-V compounds, such as GaN, AlN, InN, $In_xAl_yGa_{(1-x-y)}N$ where $x+y\leq1$, $Al_yGa_{(1-y)}N$ where $y\leq1$.

The exemplary materials of the nitride-based semiconductor layers 14 and 16 are selected such that the nitride-based semiconductor layer 16 has a bandgap (i.e., forbidden band width) greater/higher than a bandgap of the nitride-based semiconductor layer 14, which causes electron affinities thereof different from each other and forms a heterojunction therebetween. For example, when the nitride-based semiconductor layer 14 is an undoped GaN layer having a bandgap of approximately 3.4 eV, and the nitride-based semiconductor layer 16 can be selected as an AlGaN layer having bandgap of approximately 4.0 eV. As such, the nitride-based semiconductor layers 14 and 16 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction.

Accordingly, the semiconductor device 1A is available to include at least one GaN-based high-electron-mobility transistor (HEMT).

The electrodes 20 and 22 can be disposed on/over/above the nitride-based semiconductor layer 16. The electrodes 20 and 22 can be in contact with the nitride-based semiconductor layer 16.

In some embodiments, the electrode 20 can serve as a source electrode. In some embodiments, the electrode 20 can serve as a drain electrode. In some embodiments, the electrode 22 can serve as a source electrode. In some embodiments, the electrode 22 can serve as a drain electrode. The role of the electrodes 20 and 22 depends on the device design.

In some embodiments, the electrodes 20 and 22 can include, for example but are not limited to, metals, alloys, doped semiconductor materials (such as doped crystalline silicon), compounds such as silicides and nitrides, other conductor materials, or combinations thereof. The exemplary materials of the electrodes 20 and 22 can include, for example but are not limited to, Ti, AlSi, TiN, or combinations thereof. The electrodes 20 and 22 may be a single layer, or plural layers of the same or different composition. In some embodiments, the electrodes 20 and 22 form ohmic contacts with the nitride-based semiconductor layer 16. The ohmic contacts can be achieved by applying Ti, Al, or other suitable materials to the electrodes 20 and 22. In some embodiments, each of the electrodes 20 and 22 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The doped nitride-based semiconductor layer 30A can be disposed on/over/above the nitride-based semiconductor layer 16. The doped nitride-based semiconductor layer 30A can be in contact with the nitride-based semiconductor layer 16. A bottom of the doped nitride-based semiconductor layer 30A can be in contact with the nitride-based semiconductor layer 16. The gate electrode 40A can be disposed on/over/above the doped nitride-based semiconductor layer 30. The gate electrode 40A can be in contact with the doped nitride-based semiconductor layer 30A, such that the doped nitride-based semiconductor layer 30A can be disposed/sandwiched between the gate electrode 40A and the nitride-based semiconductor layer 16. The gate electrode 40A can be disposed between the electrodes 20 and 22. The gate electrode 40A and the doped nitride-based semiconductor layer 30A can be considered as a gate structure.

In the present disclosure, the doped nitride-based semiconductor layer 30A is designed to have a wide bottom to achieve electric field modulation.

FIG. 1B is an enlarged vertical cross-sectional view of a region B in FIG. 1A. The exemplary illustration of FIG. 1B depicts the doped nitride-based semiconductor layer 30, the gate electrode 40A, and the nitride-based semiconductor layers 14 and 16. The 2DEG distribution in the nitride-based semiconductor layer 14 is shown in FIG. 1B as well. In the 2DEG distribution graph, the X axis represents a horizontal distance in the nitride-based semiconductor layer 14; and the Y axis represents a 2DEG concentration in the nitride-based semiconductor layer 14. The 2DEG concentration is positively proportional to the 2DEG concentration.

Referring to FIG. 1B, the doped nitride-based semiconductor layer 30A can be designed to have protruding portions which protrudes out of two opposite edges of the gate electrode 40A. Specifically, the doped nitride-based semiconductor layer 30A includes a main body portion 302A, and protruding portions 304A and 306A. The main body portion 302A can be located between the protruding portions 304A and 306A. The main body portion 302A connects the protruding portions 304A and 306A. The protruding portion 304A extends toward the electrode 20 (see FIG. 1A), and the protruding portion 306A extends toward the electrode 22 (see FIG. 1A).

The gate electrode 40A vertically overlaps with the main body portion 302A. A bottom of the gate electrode 40A can be in contact with a top surface of the main body portion 302A. A width of the gate electrode can be substantially the same as a width of the top surface of the main body portion 302A. A width of the bottom of the doped nitride-based semiconductor layer 30A can be wider than a width of the bottom of the gate electrode 40A.

The exemplary materials of the doped nitride-based semiconductor layer 30A can be p-type doped. The doped nitride-based semiconductor layer 30A can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg. In some embodiments, the nitride-based semiconductor layer 14 includes undoped GaN and the nitride-based semiconductor layer 16 includes AlGaN, and the doped nitride-based semiconductor layer 30A is p-type GaN layer which can bend the underlying band structure upwards and to deplete or partially deplete the corresponding zone of the 2DEG region, so as to place the semiconductor device 1A into an off-state condition.

In some embodiments, the gate electrode 40A may include metals or metal compounds. The gate electrode 40A may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Si, metal alloys or compounds thereof, or other metallic compounds. In some embodiments, the exemplary materials of the gate electrodes 40A may include, for example but are not limited to, nitrides, oxides, silicides, doped semiconductors, or combinations thereof.

In the exemplary illustration of FIG. 1B, the semiconductor device 1A is an enhancement mode device, which is in a normally-off state when the gate electrode 40A is at approximately zero bias. Specifically, the p-type doped nitride-based semiconductor layer 30A may create at least one p-n junction with the nitride-based semiconductor layer 14 to deplete or partially deplete the 2DEG region, such that at least one zone of the 2DEG region corresponding to a position below the corresponding the p-type doped nitride-based semiconductor layer 30A has different characteristics (e.g., different electron concentrations) than the remaining of the 2DEG region and thus is blocked.

To be more specific, with respect to the p-type doped nitride-based semiconductor layer 30A, since the thickness thereof is correlated with the quantity of p-type impurities stored in the p-type doped nitride-based semiconductor layer 30A, portions of the p-type doped nitride-based semiconductor layer 30A with different thicknesses can achieve depletion in different degrees for the 2DEG region.

The thickness of the protruding portion 304A is labeled as thickness T1. The thickness T1 of the protruding portion 304A is substantially constant. The thickness T1 of the protruding portion 304A can be substantially equal to that of the protruding portion 306A. The thickness of the main body portion 302A is labeled as thickness T2. The thickness T2 of the main body portion 302A can be greater than the thickness T1 of the protruding portion 304A or 306A.

To clearly state the configuration, the zone Z1 of the nitride-based semiconductor layer 14 is beneath the main body portion 302A; the zone Z2 of the nitride-based semiconductor layer 14 is beneath the main body portion 304A; the zone Z3 of the nitride-based semiconductor layer 14 is beneath the main body portion 306A; the zone Z4 of the nitride-based semiconductor layer 14 is free from coverage of the p-type doped nitride-based semiconductor layer 30A and abuts against the zone Z2; and the zone Z5 of the nitride-based semiconductor layer 14 is free from coverage of the p-type doped nitride-based semiconductor layer 30A and abuts against the zone Z3.

Therefore, the main body portion 302A can deplete electrons in the zone Z1 more than the zone Z2. That is, the number of the electrons in the zone Z1 of the nitride-based semiconductor layer 14 deplete by the main body portion 302A is more than the number of the electrons in the zone Z2 of the nitride-based semiconductor layer 14 deplete by the protruding portion 304A. Similarly, the main body portion 302A can deplete electrons in the zone Z1 more than electrons in a zone Z3 of the nitride-based semiconductor layer 14 deplete by the protruding portion 306A. Furthermore, the zones Z4 and Z5 are free from coverage of the p-type doped nitride-based semiconductor layer 30A, and thus depletion to electrons there is lighter than the zones Z1-Z3.

As such, the 2DEG concentration of the zone Z1 is less than the 2DEG concentrations of the zones Z2 and Z3. For example, the 2DEG concentration of the zone Z1 can be labeled as a value A; and the 2DEG concentration of the zone Z2 or Z3 can be labeled as a value B, where the value A is less than the value B. The 2DEG concentration of the zones Z4 and Z5 is greater than 2DEG concentrations of the zones Z2 and Z3. For example, the 2DEG concentration of the zone Z4 or Z5 can be labeled as a value C, where the value B is less than the value C. In the exemplary illustration of FIG. 1B, the value A approaches to zero, meaning undepleted electrons still exist in the zone Z1. In other embodiments, the value A is about zero, so electrons in the zone Z1 are almost depleted. The 2DEG concentration in the zone Z1 is not sufficient to make the device to be conducted.

Due to this mechanism, the semiconductor device 1A has a normally-off characteristic. In other words, when no voltage is applied to the gate electrode 40A or a voltage applied to the gate electrode 40A is less than a threshold voltage (i.e., a minimum voltage required to form an inversion layer below the gate electrode 40A), the zone of the 2DEG region below the gate electrode 40A is kept blocked, and thus no current flows therethrough.

Furthermore, the surfaces of the doped nitride-based semiconductor layer 30A are shaped as stepwise profile at its two opposite sides, respectively. One single step is present in the stepwise profile. The 2DEG concentration distribution can be determined/controlled by the stepwise profile of the p-type doped nitride-based semiconductor layer 30A. Correspondingly, the stepwise profile of the p-type doped nitride-based semiconductor layer 30A makes the 2DEG concentration distribution stepwise in the nitride-based semiconductor layer 14.

Figure 1C:
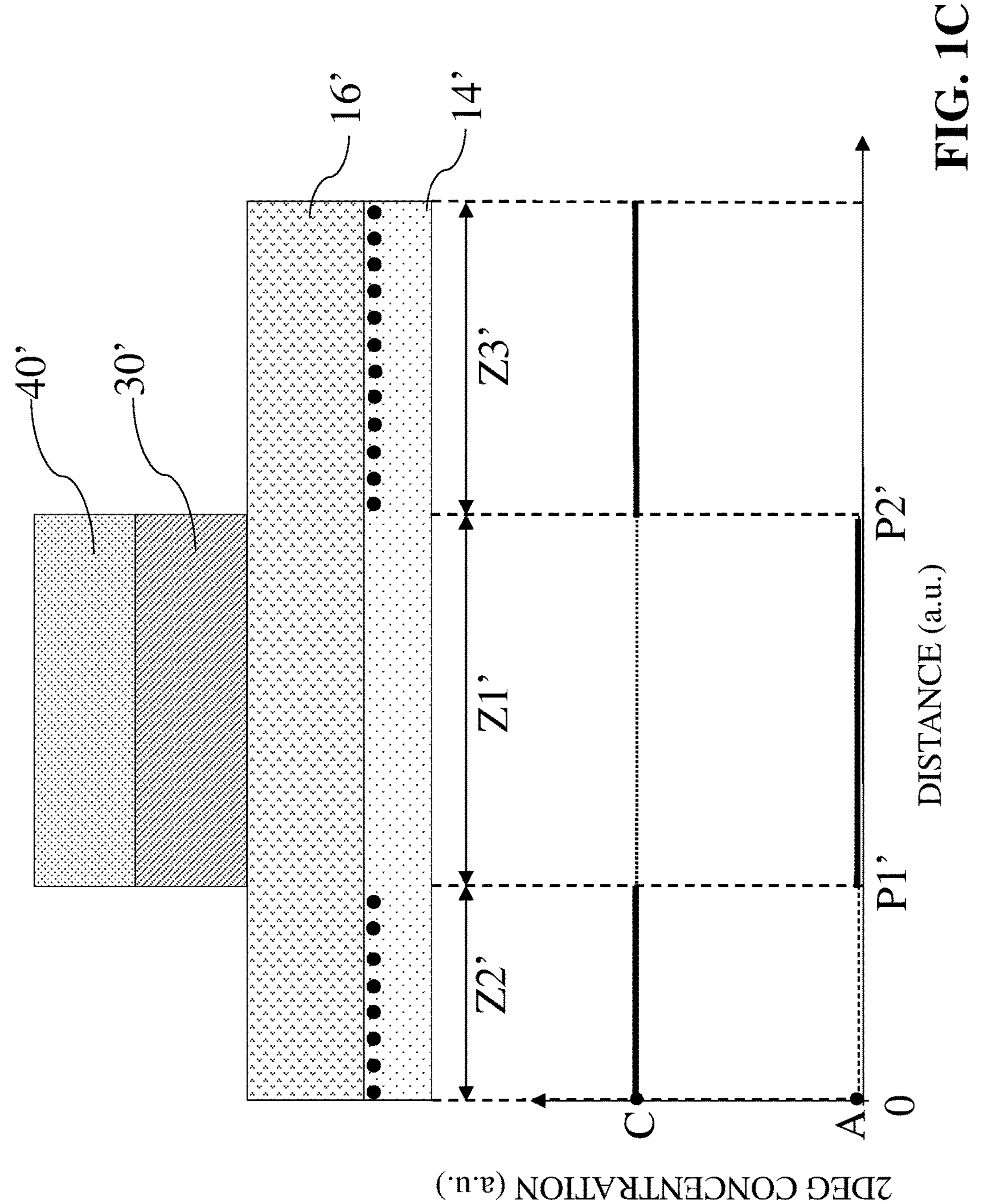
FIG. 1C is an enlarged vertical cross-sectional view of a semiconductor device according to comparative embodiments.

The stepwise 2DEG concentration distribution can reduce the electric field peak. To illustrate the modulation to the semiconductor device 1A, a comparative embodiment is shown in FIG. 1C, which is an enlarged vertical cross-sectional view of a semiconductor device 1' according to comparative embodiments.

The semiconductor device 1' includes a p-type doped nitride-based semiconductor layer 30' and a gate electrode 40A' on the p-type doped nitride-based semiconductor layer 30'. The p-type doped nitride-based semiconductor layer 30' is formed on nitride-based semiconductor layers 14 and 16 to modulate a 2DEG region between the nitride-based semiconductor layers 14' and 16'. The p-type doped nitride-based semiconductor layer 30' does not have any protruding portions at its sidewalls. The p-type doped nitride-based semiconductor layer 30' is formed to have a thickness enough to deplete the 2DEG region and thus the 2DEG concentration there approaches to zero. Accordingly, the 2DEG region is blocked.

With respect to the semiconductor device 1', the p-type doped nitride-based semiconductor layer 30' can entirely deplete electrons in a zone Z1' of the nitride-based semiconductor layer 14. Because zones Z2' and Z3' are free from coverage of the p-type doped nitride-based semiconductor layer 30', most of electrons in the zones Z2' and Z3' are without depleted.

However, the thickness of the p-type doped nitride-based semiconductor layer 30' sharply changes at positions P1' and P2', so the 2DEG concentration near positions P1' and P2' sharply decreases or increases. Accordingly, strong surface electric fields are generated at the positions P1' and P2' (e.g., corner of the doped nitride-based semiconductor layer 30') due to the dramatic change of 2DEG concentration, thereby deteriorating electrical properties of the semiconductor device 1'.

Referring back to FIG. 1B, with respect to the semiconductor device 1A from the protruding portion 304A to the main body portion 302A, the thickness of the semiconductor device 1A changes from the thickness Ti to the thickness T2. As the protruding portion 304A spans across from a position P1 to a position P2, the 2DEG concentration decreases at the positions P1 and P2. The 2DEG concentration decreases from the value C to the value B at the position P1. The variation of the 2DEG concentration at the position P1 is labeled as the variation ΔR1. The 2DEG concentration decreases from the value B to the value A at the position P2. The variation of the 2DEG concentration at the position P2 is labeled as the variation ΔR2. As such, the variation of the 2DEG concentration from the position P1 to the position P2 is gradual and it is not as sharp as described in FIG. 1C. Herein, the gradual variation means the variation ΔR1 and ΔR2 of the 2DEG concentration are less than the difference between the values C and A.

From the main body portion 302A to the protruding portion 306A of the semiconductor device 1A, the thickness of the semiconductor device 1A changes from the thickness T2 to the thickness T1. As the protruding portion 306A spans across from a position P3 to a position P4, the 2DEG concentration increase at the positions P3 and P4. The 2DEG concentration decreases from the value A to the value B at the position P3. The variation of the 2DEG concentration at the position P3 is labeled as the variation ΔR3. The 2DEG concentration decreases from the value B to the value C at the position P4. The variation of the 2DEG concentration at the position P4 is labeled as the variation ΔR4. As such, the variation of the 2DEG concentration from the position P3 to the position P4 is gradual and is not as sharp as described in FIG. 1C. Herein, the gradual variation means the variation ΔR3 and ΔR4 of the 2DEG concentration are less than the difference between the values A and C.

In this regard, a smaller 2DEG concentration gap can be achieved in the semiconductor device 1A. That is to say, the variation of the 2DEG concentrations goes gradually from the positions P1 to P4. As compared to the semiconductor device 1', the strength of the surface electric field can change gradually (i.e., gradual increase or decrease) rather than sharply due to the gradual variation of the 2DEG concentration, thereby reducing/alleviating the breakdown. The reason is the single peak of the surface electric field can be modulated as being wider (i.e., the distribution range of the peak is widened). Thus, the protruding portions 304A and 306A can be regarded as reduced surface field (RESURF) structures.

From another point of view, the configuration of the protruding portions 304A and 306A can modulate the zones Z2 and Z3 so the zones Z2 and Z3 can serve as 2DEG concentration buffer zones. The 2DEG concentration buffer zone Z2 can be located between the zone Z4 having the higher 2DEG concentration and the zone Z1 having the lower 2DEG concentration. The 2DEG concentration buffer zone Z3 can be located between the zone Z5 having the higher 2DEG concentration and the zone Z1 having the lower 2DEG concentration. The introduction of the 2DEG concentration buffer zones Z2 and Z3 is advantageous to reduce extent of change/variation of the 2DEG concentration.

Furthermore, in some embodiments, the electrode 20 can be a source electrode, and the electrode 24 can be a drain electrode. During the operation, the drain electrode is applied to a higher bias voltage than the source electrode, so the electric field peak would occur/appear at the drain side of the gate electrode 40A. In order to suppress the peak intensity of the electric field, the positions of the electrodes 20 and 22 can be designed to be asymmetrical about the gate electrode 40A. Specifically, a distance from the gate electrode 40A to the electrode 22 can be designed to be greater than a distance from the gate electrode 40A to the electrode 20, so that the electric field distribution at the drain side can be consistent with the electric field distribution at the source side.

With respect to the asymmetry of the source and drain design, the extending length of the protruding portion 306A can be designed to be greater than that of the protruding portion 304A, so that the doped nitride-based semiconductor layer 30A has a profile asymmetrical about the gate electrode 40A. As compared to the protruding portion 304A, the longer protruding portion 306A can split the electric field and induce an additional electric field peak at a position farther than the gate electrode 40A. By employing such a design, the electric field distribution at the source side can be more consistent with the electric field distribution at the drain side, and thus an improved electric field distribution can be achieved.

By the longer protruding portion 306A, the profile of the doped nitride-based semiconductor layer 30A can cooperate with the field plate 50 to further modulate the electric field distribution.

Referring back to the FIG. 1A, the field plates 50, 52, 54 and the dielectric layers 60, 62, 64, 66 are alternatively stacked on the nitride-based semiconductor layer 16. The dielectric layer 60 can be disposed on/over/above the p-type doped nitride-based semiconductor layer 30, the gate electrode 40A, the electrode 22, and the nitride-based semiconductor layer 16. The dielectric layer 60 can cover surfaces of the protruding portions 304A and 306A.

The field plate 50 can be disposed on/over/above the dielectric layer 60. The field plate 50 can be positioned in a region between the gate electrode 40A and the electrode 22. An entirety of the field plate 50 is in a position higher than the gate electrode 40A. The dielectric layer 60 can be disposed between the nitride-based semiconductor layer 16 and the field plate 50. The gate electrode 40A and the field plate 50 are separated from each other by a portion of the dielectric layer 60. The portion of the dielectric layer 60 directly makes contact with the surfaces of the protruding portions 304A and 306A.

The dielectric layer 62 can be disposed on the field plate 50 and the dielectric layer 60, such that the field plate 50 can be disposed/sandwiched between the dielectric layers 60 and 62.

The field plate 52 can be disposed on/over/above the dielectric layer 62, the doped nitride-based semiconductor layer 30A, and the field plate 50. The field plate 52 can be positioned in a region between the field plate 52 and the electrode 22. An entirety of the field plate 52 is in a position higher than the field plate 50. A vertical projection of the field plate 52 on the nitride-based semiconductor layer 16 is separated from the vertical projection of the doped nitride-based semiconductor layer 30A on the nitride-based semiconductor layer 16 and overlaps with the vertical projection of the field plate 50 on the nitride-based semiconductor layer 16 Accordingly, the field plates 50 and 52 can collaboratively modulate the electric field distribution at the drain side of the gate electrode, so as to achieve a better electrical distribution.

The dielectric layer 64 can be disposed on the field plate 52 and the dielectric layer 62, such that the field plate 52 can be disposed/sandwiched between the dielectric layers 62 and 64.

The field plate 54 can be disposed on/over/above the dielectric layer 64. An entirety of the field plate 54 is in a position higher than the field plate 52.

The dielectric layer 66 can be disposed on/over/above the field plate 54 and the dielectric layer 64, such that the field plate 54 can be disposed/sandwiched between the dielectric layers 64 and 66.

The connection portion 56 is disposed on/over/above the electrode 20. The field plate 56 connects the field plate 54 and the electrode 20. The voltage level of the field plates 54 and 56 can be the same as that of the electrode 20. In some embodiments, the embedded field plates 50 and 52 can be electrically connected to the electrode 20, such that the voltage level of the field plates 50 and 52 can be the same as that of the field plates 54 and 56, and the electrode 20. In some embodiments, the embedded field plates 50 and 52 can be electrically floated.

Once the electric field lines concentrate at the drain edge of the gate electrode 40A, the electric field peak may appear at the region adjacent to the drain edge. The protruding portion 306A can be designed to extend toward the electrode 22 and underneath the field plate 50. As such, the modulation to the electric field distribution is continuous from the doped nitride-based semiconductor layer 30A to the field plate 50 along the horizontal direction.

In this regard, since the doped nitride-based semiconductor layer has the profile asymmetrical about the gate electrode 40A, the profile of the doped nitride-based semiconductor layer 30A is adapted to the configuration that protruding portion 306 extends underneath the field plate 50. That is, by the forming the doped nitride-based semiconductor layer as being asymmetrical, the 2DEG concentration buffer zones can be created, and the doped nitride-based semiconductor layer 30A can further provide the continuous electric field modulation with the field plate 50.

Accordingly, the field plate 50 and the protruding portion 306A of the doped nitride-based semiconductor layer 30A can collaboratively modulate the electric field distribution at the drain side of the gate electrode, so as to achieve a better electrical distribution.

More specifically, the field plate 50 has an end portion directly located above the protruding portion 306A. A vertical projection of the doped nitride-based semiconductor layer 30A on the nitride-based semiconductor layer 16 can be designed to overlaps with a vertical projection of the field plate 50 on the nitride-based semiconductor layer 16.

Moreover, a vertical projection of the gate electrode 40A on the nitride-based semiconductor layer 16 is physically separated from the vertical projection of the field plate 50 on the nitride-based semiconductor layer 16. In the other point of view, the gate electrode 40A forms an interface IF with the doped nitride-based semiconductor layer 30A therebetween. The interface IF is vertically spaced apart from the field plate 50. Such a configuration can avoid generate unwanted parasite capacitance between the gate electrode 40A and the field plate 50.

The exemplary materials of the field plates 50, 52, 54 and the connection portion 56 can include, for example but are not limited to, conductive materials, such as Ti, Ta, TiN, TaN, or combinations thereof. In some embodiments, other conductive materials such as Al, Cu doped Si, and alloys including these materials may also be used.

The material of the dielectric layers 60, 62, 64, and 66 can include, for example but is not limited to, dielectric materials. For example, the dielectric layers 60, 62, 64, and 66 can include $SiN_x$ (e.g., $Si_3N_4$), $SiO_x$, $Si_3N_4$, SiON, SiC, SiBN, SiCBN, oxides, nitrides, oxides, nitrides, plasma-enhanced oxide (PEOX), tetraethoxysilane normal abbreviation (TEOS), or combinations thereof.

Furthermore, the dielectric layer 66 can serve as a planarization layer which has a level top surface to support other layers/elements. In some embodiments, the dielectric layer 66 can be formed as being thicker, and a planarization process, such as a chemical mechanical polish (CMP) process, is performed on the dielectric layer 66 to remove the excess portions, thereby forming a level top surface.

Different stages of a method for manufacturing the semiconductor device 1A are shown in FIG. 2A, FIG. 2B, FIG. 2C, and FIG. 2D, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figures 2A, 2B:
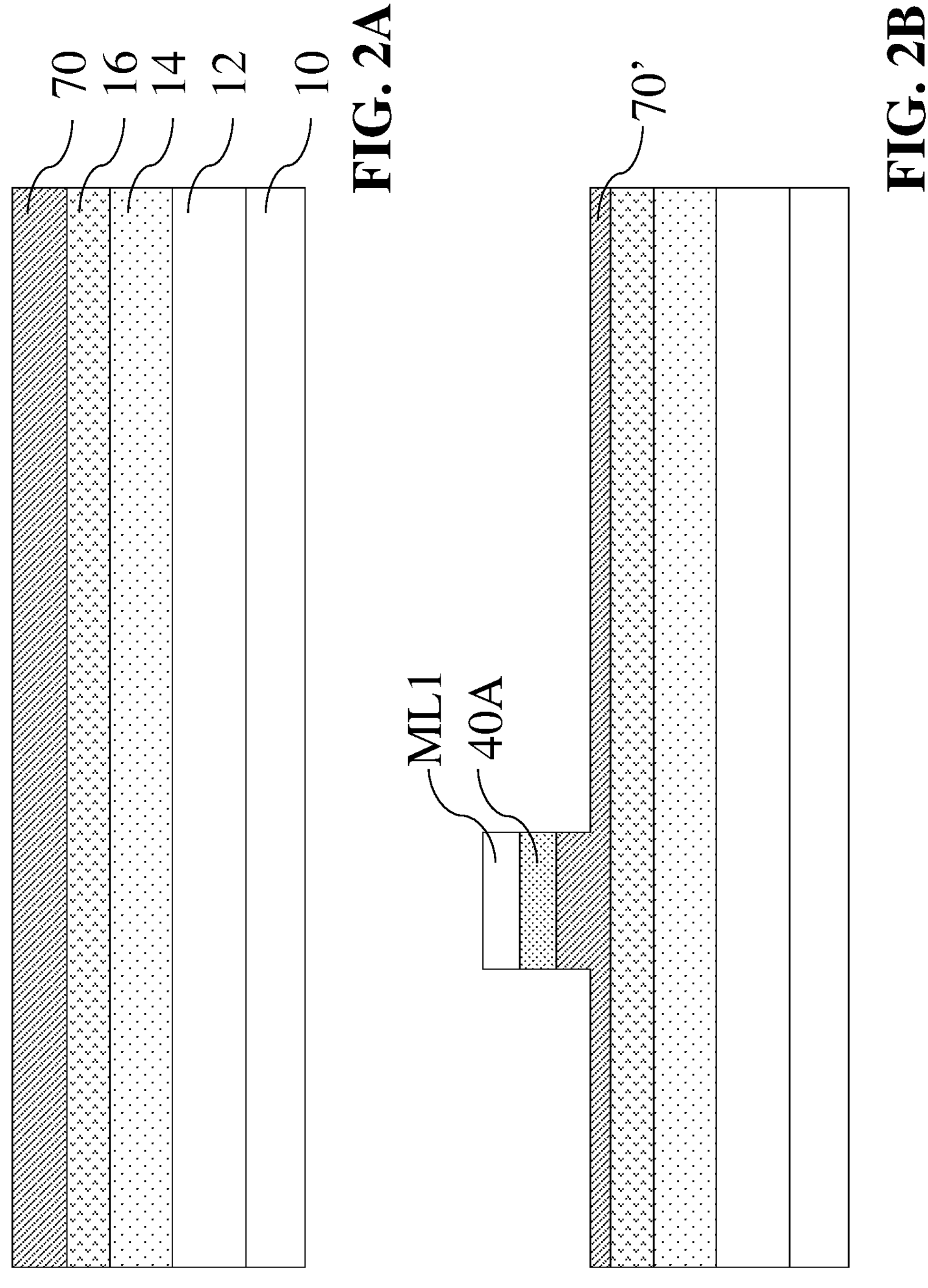
FIG. 2A, FIG. 2B, FIG. 2C, and FIG. 2D show different stages of a method for manufacturing a nitride-based semiconductor device according to some embodiments of the present disclosure.

Referring to FIG. 2A, a buffer layer 12 can be formed on/over/above the substrate 10 by using the above-mentioned deposition techniques. A nitride-based semiconductor layer 14 can be formed on/over/above the buffer layer 12 by using the above-mentioned deposition techniques. A nitride-based semiconductor layer 16 can be formed on/over/above the nitride-based semiconductor layer 14 by using the above-mentioned deposition techniques. A blanket doped nitride-based semiconductor layer 70 can be formed on/over/above the nitride-based semiconductor layer 16.

Referring to FIG. 2B, a blanket gate conductive layer is formed on/over/above the blanket doped nitride-based semiconductor layer 70. A mask layer ML1 is formed on the blanket gate electrode layer. Then, a patterning process is performed on the blanket doped nitride-based semiconductor layer 70 by using the mask layer ML1, such that the excess portions of the blanket gate electrode layer and the blanket doped nitride-based semiconductor layer 70 are removed, thereby forming a gate electrode and an intermediate doped nitride-based semiconductor layer 70'. The mask layer ML1 remains on the gate electrode 40A during patterning the blanket doped nitride-based semiconductor layer 70 and the blanket gate electrode layer.

Figures 2C, 2D:
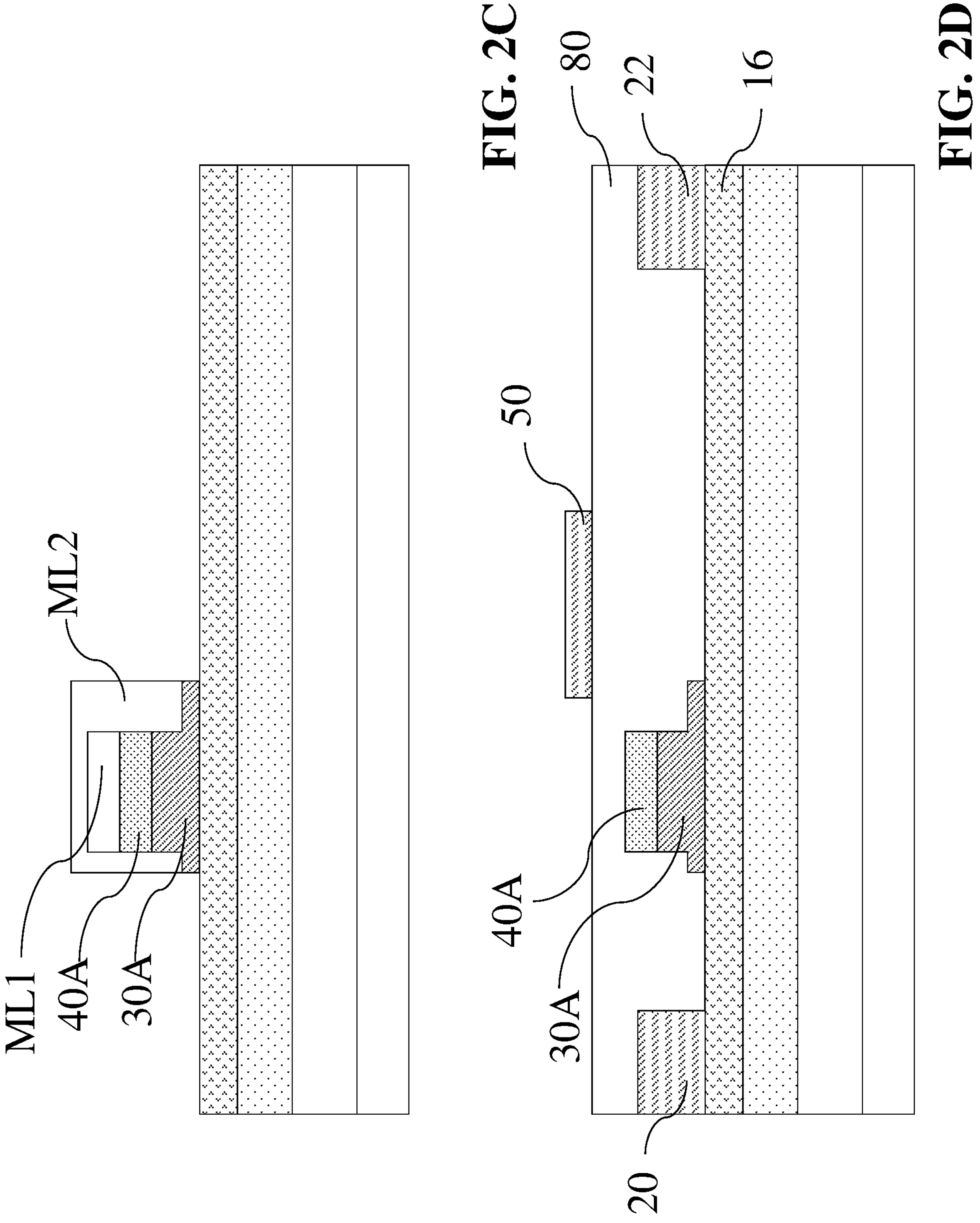

Referring to FIG. 2C, another mask layer ML2 is formed to cover the gate electrode 40A, the mask layer ML1, and a part of the intermediate doped nitride-based semiconductor layer 70'. Then, a patterning process is performed on the intermediate blanket doped nitride-based semiconductor layer 70' by using the gate electrode 40A, and the mask layers ML1 and ML2, such that the excess portions of the intermediate doped nitride-based semiconductor layer 70' are removed, thereby forming a doped nitride-based semiconductor layer 70 wider than the gate electrode 40A. The doped nitride-based semiconductor layer 30A is formed to have a profile asymmetrical about the gate electrode 40A.

Referring to FIG. 2D, the mask layers ML1 and ML2 are removed. Electrodes 20 and 22 are formed on/over/above the nitride-based semiconductor layer 16. An intermediate dielectric layer 80 is formed to cover the electrodes 20 and 22, the doped nitride-based semiconductor layer 30A, and the gate electrode 40A. A field plate 50 is formed on the intermediate dielectric layer 80.

The formation of the electrodes 20 and 22, and the field plate 50 includes deposition techniques and a patterning process. In some embodiments, the deposition techniques can be performed for forming a blanket layer, and the patterning process can be performed for removing excess portions thereof. In some embodiments, the patterning process can include photolithography, exposure and development, etching, other suitable processes, or combinations thereof. Thereafter, the dielectric layers 60, 62, 64 and 66, the field plates 52, 54, and the connection portion 56 are formed, obtaining the configuration of the semiconductor device 1A as shown in FIG. 1A.

The technical means of the present disclosure can be adapted to different process conditions, so it is available to modify the profile of the doped nitride-based semiconductor layer according to different requirements. Embodiments as follows show the various profiles of the doped nitride-based semiconductor layer. Those various profiles of the doped nitride-based semiconductor layer can be applied to HEMT device for matching different device requirements, such as high voltage, low voltage, or high operating frequency.

Figure 3:
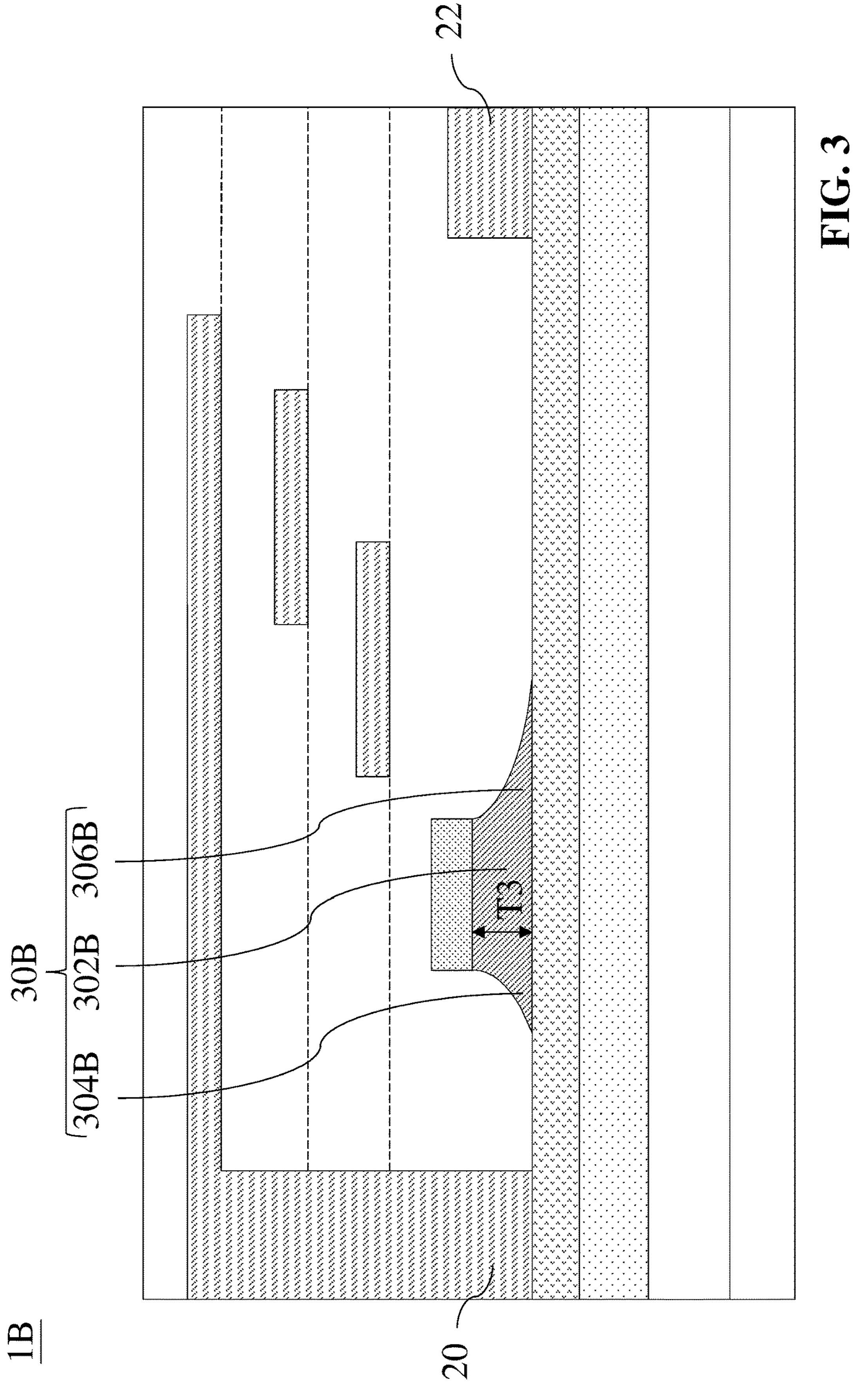
FIG. 3 is a vertical cross-sectional view of a semiconductor device according to some embodiments of the present disclosure.

FIG. 3 is a vertical cross-sectional view of a semiconductor device 1B according to some embodiments of the present disclosure. The semiconductor device 1B is similar to the semiconductor device 1A as described and illustrated with reference to FIG. 1A, except that the p-type doped nitride-based semiconductor layer 30A in FIG. 1A is replaced by the doped nitride-based semiconductor layer 30B.

The doped nitride-based semiconductor layer 30B has a main body portion 302B, and protruding portions 304B and 306B. The main body portion 302B has a thickness T3. The protruding portion 304B has a thickness gradually/continuously decreasing along a direction toward the electrode 20. The thickness of the protruding portion 304B decreases from the thickness T3 to about 0. The protruding portion 306B has a thickness gradually/continuously decreasing along a direction toward the electrode 22. The thickness of the protruding portion 306B decreases from the thickness T3 to about 0.

Each of the protruding portions 306A and 306B has at least one curved side surface. Therefore, the 2DEG concentration of the 2DEG region beneath the protruding portions 304B and 306B can continuously change. Thus, the 2DEG concentration distribution can be continuous, and no obvious gap is generated in the variation of the 2DEG concentration.

Figure 4:
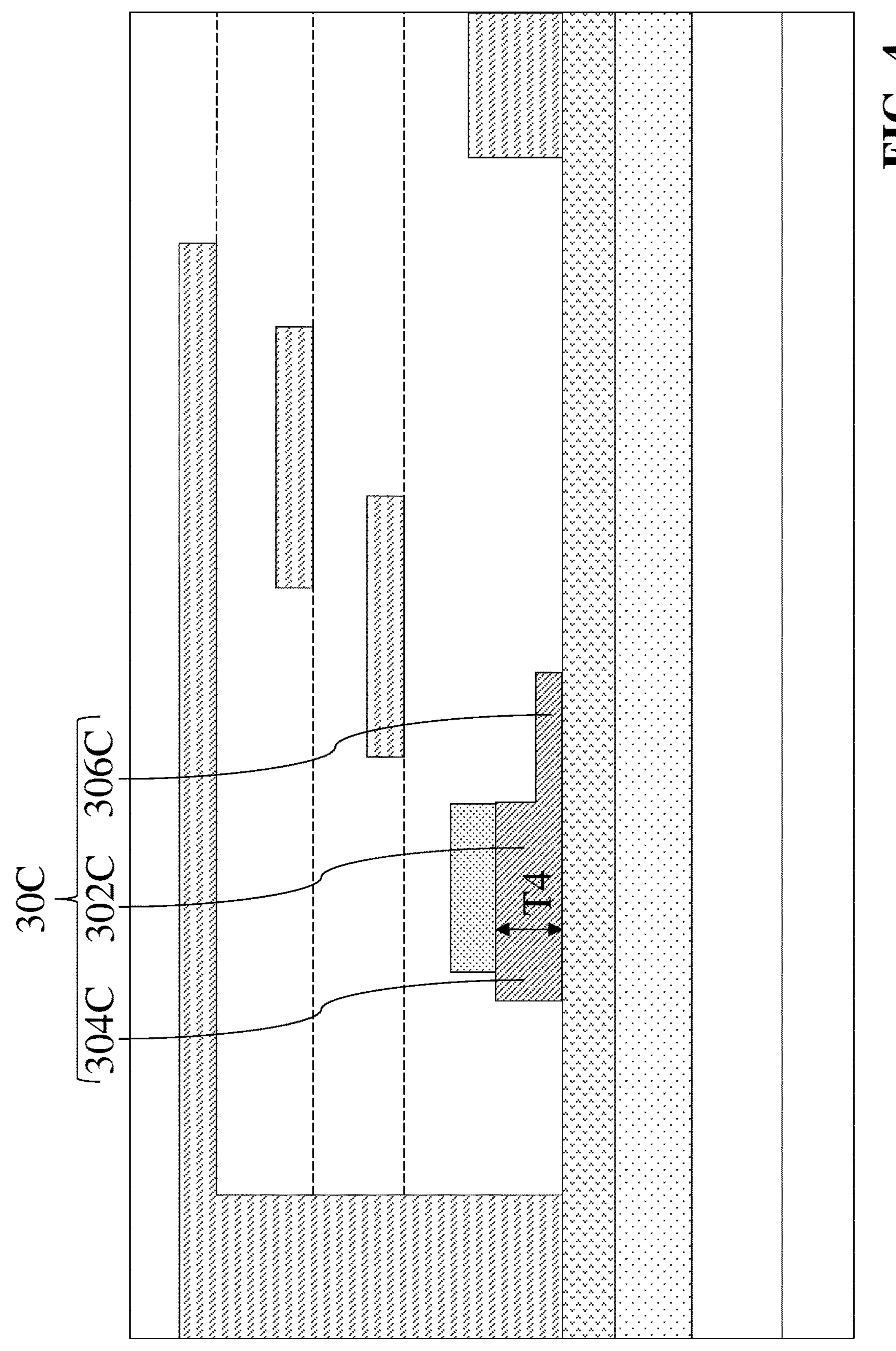
FIG. 4 is a vertical cross-sectional view of a semiconductor device according to some embodiments of the present disclosure.

FIG. 4 is a vertical cross-sectional view of a semiconductor device 1C according to some embodiments of the present disclosure. The semiconductor device 1C is similar to the semiconductor device 1A as described and illustrated with reference to FIG. 1A, except that the p-type doped nitride-based semiconductor layer 30A in FIG. 1A is replaced by the doped nitride-based semiconductor layer 30C. The doped nitride-based semiconductor layer 30C has a main body portion 302C, and protruding portions 304C and 306C. The main body portion 302C and protruding portion 304C have substantially the same thickness T4. The thickness T4 of the main body portion 302C is greater than that of the protruding portion 306C.

Figure 5:
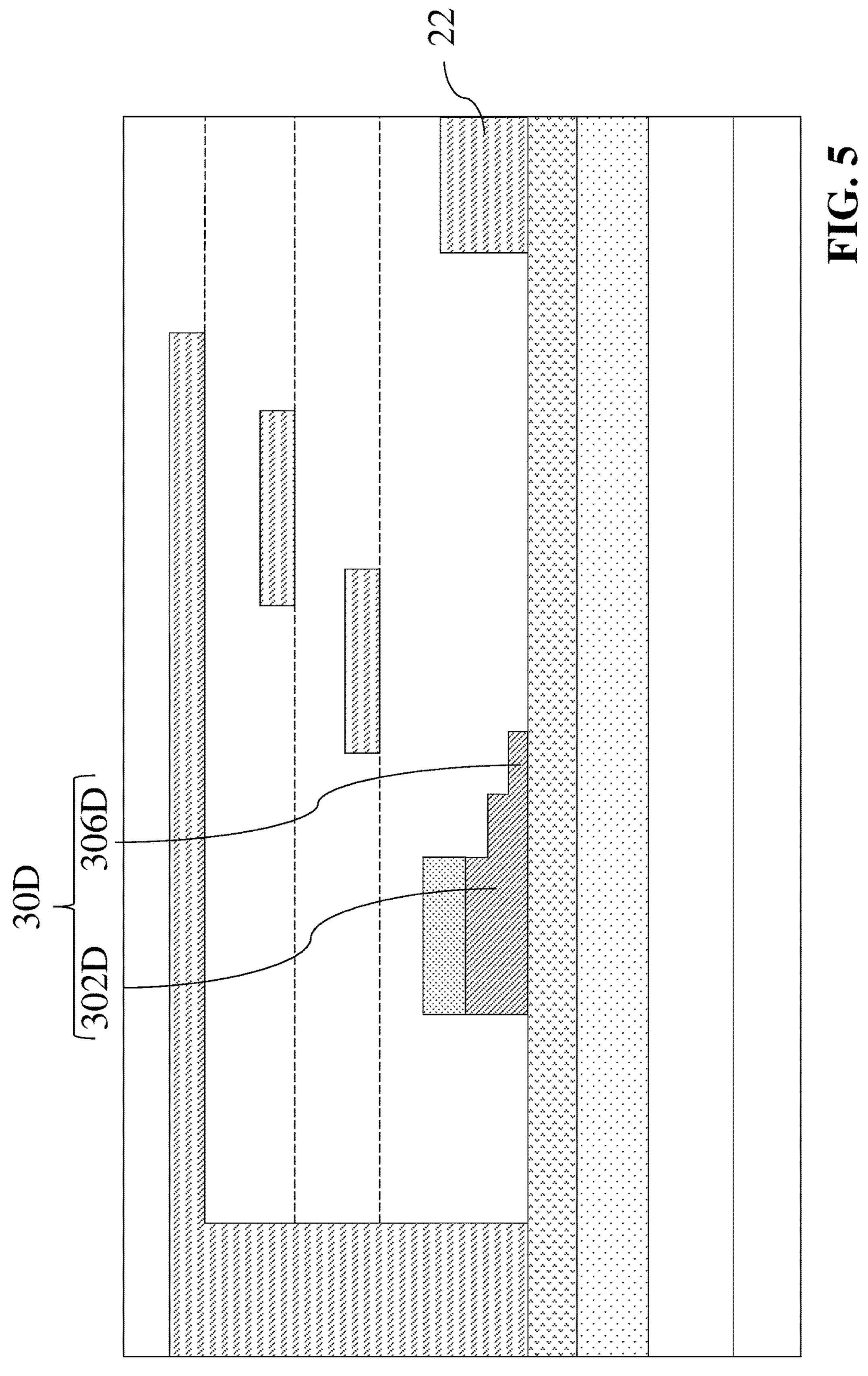
FIG. 5 is a vertical cross-sectional view of a semiconductor device according to some embodiments of the present disclosure.

FIG. 5 is a vertical cross-sectional view of a semiconductor device 1D according to some embodiments of the present disclosure. The semiconductor device 1D is similar to the semiconductor device 1A as described and illustrated with reference to FIG. 1A, except that the p-type doped nitride-based semiconductor layer 30A in FIG. 1A is replaced by the doped nitride-based semiconductor layer 30D. The p-type doped nitride-based semiconductor layer 30D has a main body portion 302D and a protruding portion 306D. The protruding portion 306D extends toward the electrode 22. The surfaces of the protruding portion 306D form a stepwise profile with multi-steps.

Figure 6:
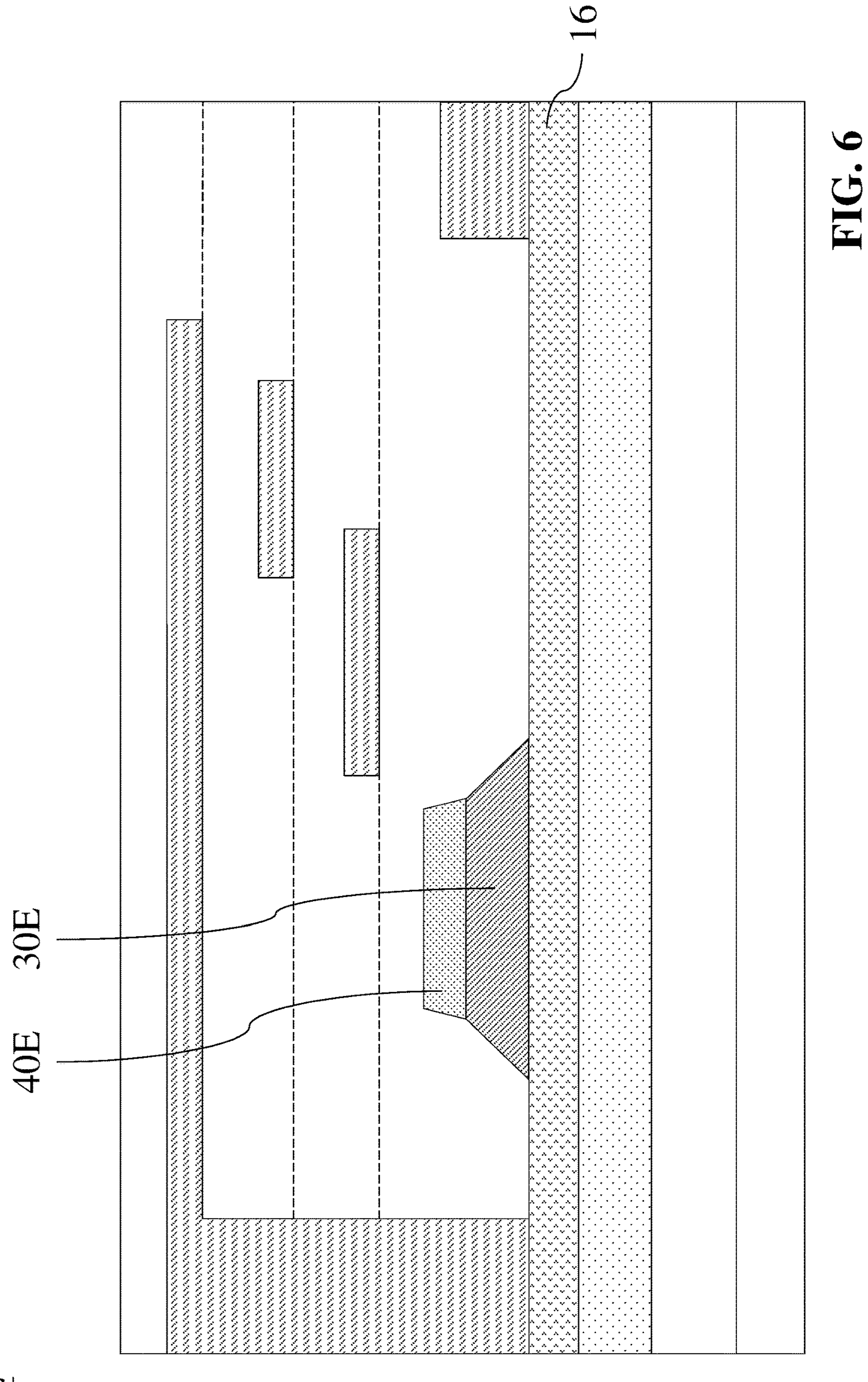
FIG. 6 is a vertical cross-sectional view of a semiconductor device according to some embodiments of the present disclosure.

FIG. 6 is a vertical cross-sectional view of a semiconductor device 1E according to some embodiments of the present disclosure. The semiconductor device 1E is similar to the semiconductor device 1A as described and illustrated with reference to FIG. 1A, except that the p-type doped nitride-based semiconductor layer 30A and the gate electrode 40A in FIG. 1A are replaced by a doped nitride-based semiconductor layer 30E and a gate electrode 40E.

The p-type doped nitride-based semiconductor layer 30E is shaped as being trapezoid. The gate electrode 40E is shaped as being trapezoid. The trapezoid doped nitride-based semiconductor layer 30E has a top width substantially the same as a bottom width of the trapezoid gate electrode 40E. The trapezoid doped nitride-based semiconductor layer 30E and the trapezoid gate electrode 40E have side surfaces in different oblique angles, respectively. Specifically, an include angle between the side surface of the trapezoid doped nitride-based semiconductor layer 30E and a top surface of the nitride-based semiconductor layer 16 can be greater than an include angle between the side surface of the trapezoid gate electrode 40E and a top surface of the trapezoid doped nitride-based semiconductor layer 30E.

With respect to the semiconductor device 1E, the profile of the p-type doped nitride-based semiconductor layer 30E can be achieved by tuning at least one process parameter, so no further shaping process is required. Different stages of a method for manufacturing the semiconductor device 1E are shown in FIG. 7A, FIG. 7B, FIG. 7C, and FIG. 7D, as described below.

Figures 7A, 7B:
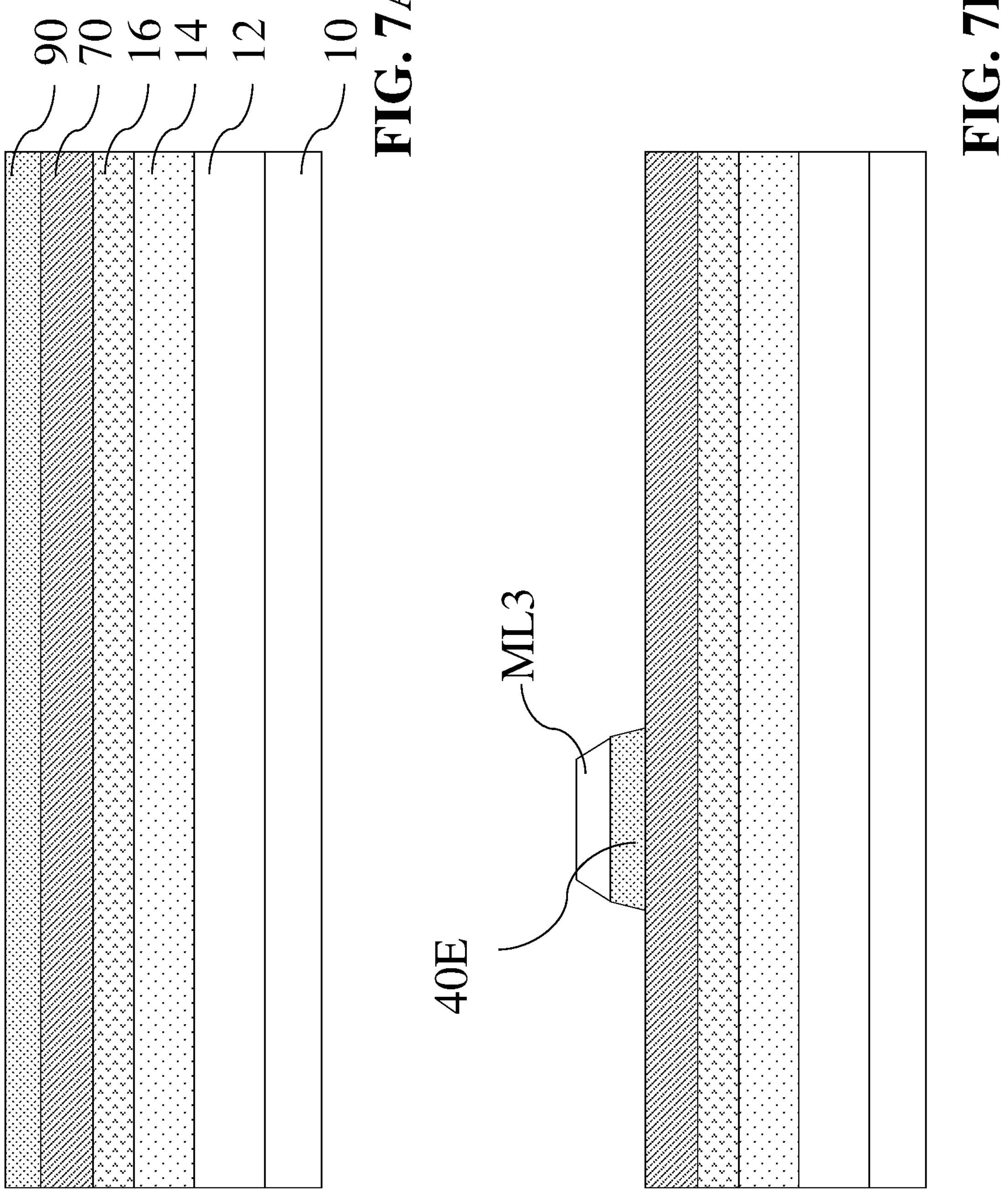
FIG. 7A, FIG. 7B, FIG. 7C, and FIG. 7D show different stages of a method for manufacturing a nitride-based semiconductor device according to some embodiments of the present disclosure.

Referring to FIG. 7A, a buffer layer 12 can be formed on/over/above the substrate 10 by using the above-mentioned deposition techniques. A nitride-based semiconductor layer 14 can be formed on/over/above the buffer layer 12 by using the above-mentioned deposition techniques. A nitride-based semiconductor layer 16 can be formed on/over/above the nitride-based semiconductor layer 14 by using the above-mentioned deposition techniques. A blanket doped nitride-based semiconductor layer 70 is formed on/over/above the nitride-based semiconductor layer 16. A blanket gate electrode layer 90 is formed on/over/above the blanket doped nitride-based semiconductor layer 70.

Referring to FIG. 7B, a mask layer ML3 is formed on the blanket gate electrode layer 90. Then, a patterning process is performed on the blanket gate electrode layer 90 by using the mask layer ML3, such that the excess portions of the blanket gate electrode layer 90 are removed, thereby forming a trapezoid gate electrode 40E. The mask layer ML3 remains on the trapezoid gate electrode 40E during patterning the blanket gate electrode layer 90. The extent of inclination of the side surface of the trapezoid gate electrode 40E can be controlled by tuning at least one parameter, such as temperature, or pressure.

Figures 7C, 7D:
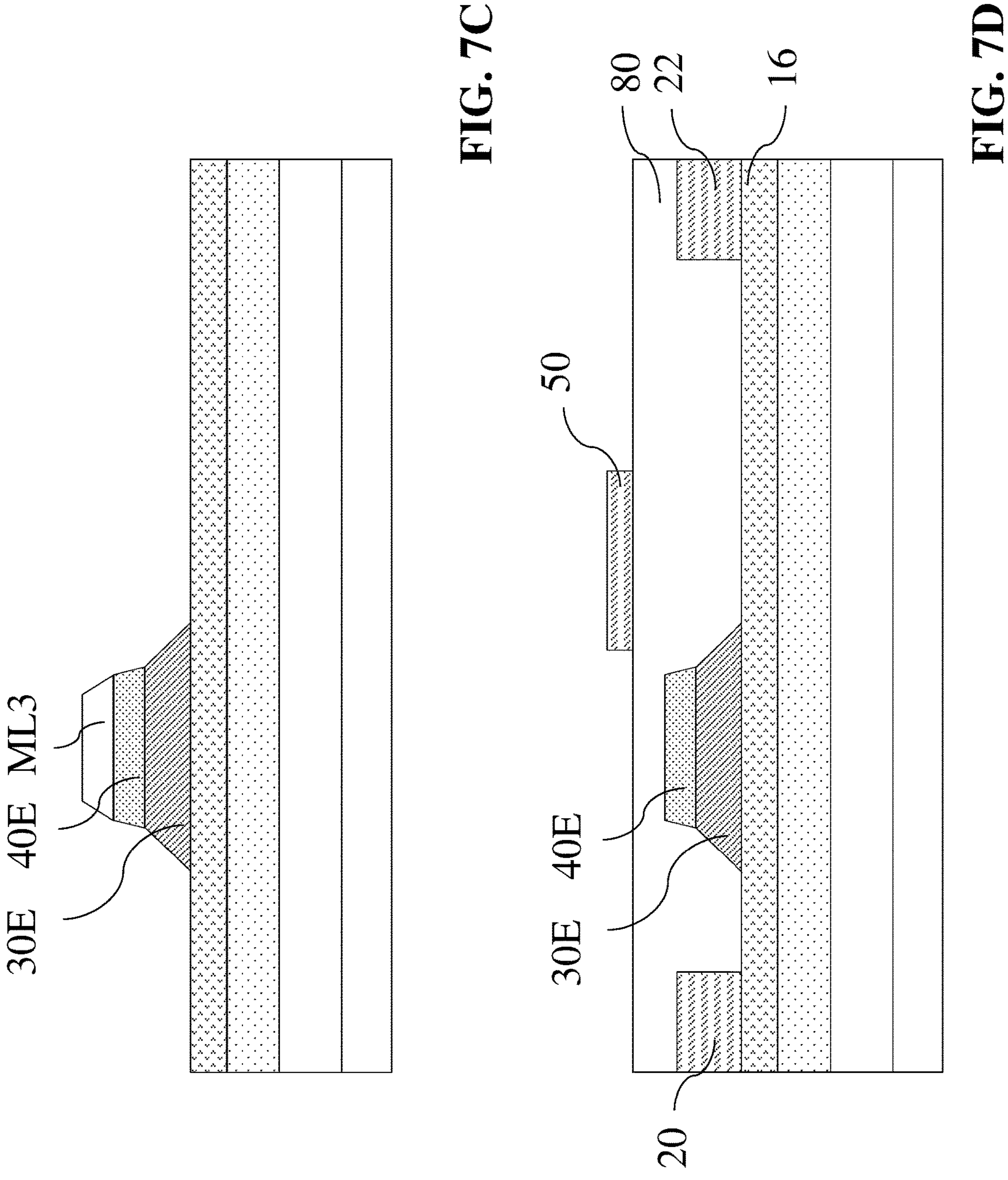

Referring to FIG. 7C, a patterning process is performed on the blanket doped nitride-based semiconductor layer 70 by using the mask layer ML3 and the trapezoid gate electrode 40E, such that the excess portions of the blanket doped nitride-based semiconductor layer 70 are removed, thereby forming a trapezoid doped nitride-based semiconductor layer 30E. The mask layer ML3 remains on the doped nitride-based semiconductor layer 30E during patterning the blanket doped nitride-based semiconductor layer 70. The extent of inclination of the side surface of the trapezoid doped nitride-based semiconductor layer 30E can be controlled by tuning at least one parameter, such as temperature, or pressure.

Referring to FIG. 7D, the mask layer ML3 is removed. An intermediate dielectric layer 80 is formed to cover the electrodes 20 and 22, the trapezoid doped nitride-based semiconductor layer 30E, and the trapezoid gate electrode 40E. A field plate 50 is formed on the intermediate dielectric layer 80, such that a vertical projection of the trapezoid doped nitride-based semiconductor layer 30E on the nitride-based semiconductor layer 16 overlaps with a vertical projection of the field plate 50 on the nitride-based semiconductor layer 16, and such that a vertical projection of the trapezoid gate electrode 40E on the nitride-based semiconductor layer 16 is physically separated from the vertical projection of the field plate 50 on the nitride-based semiconductor layer 16.

Figure 8:
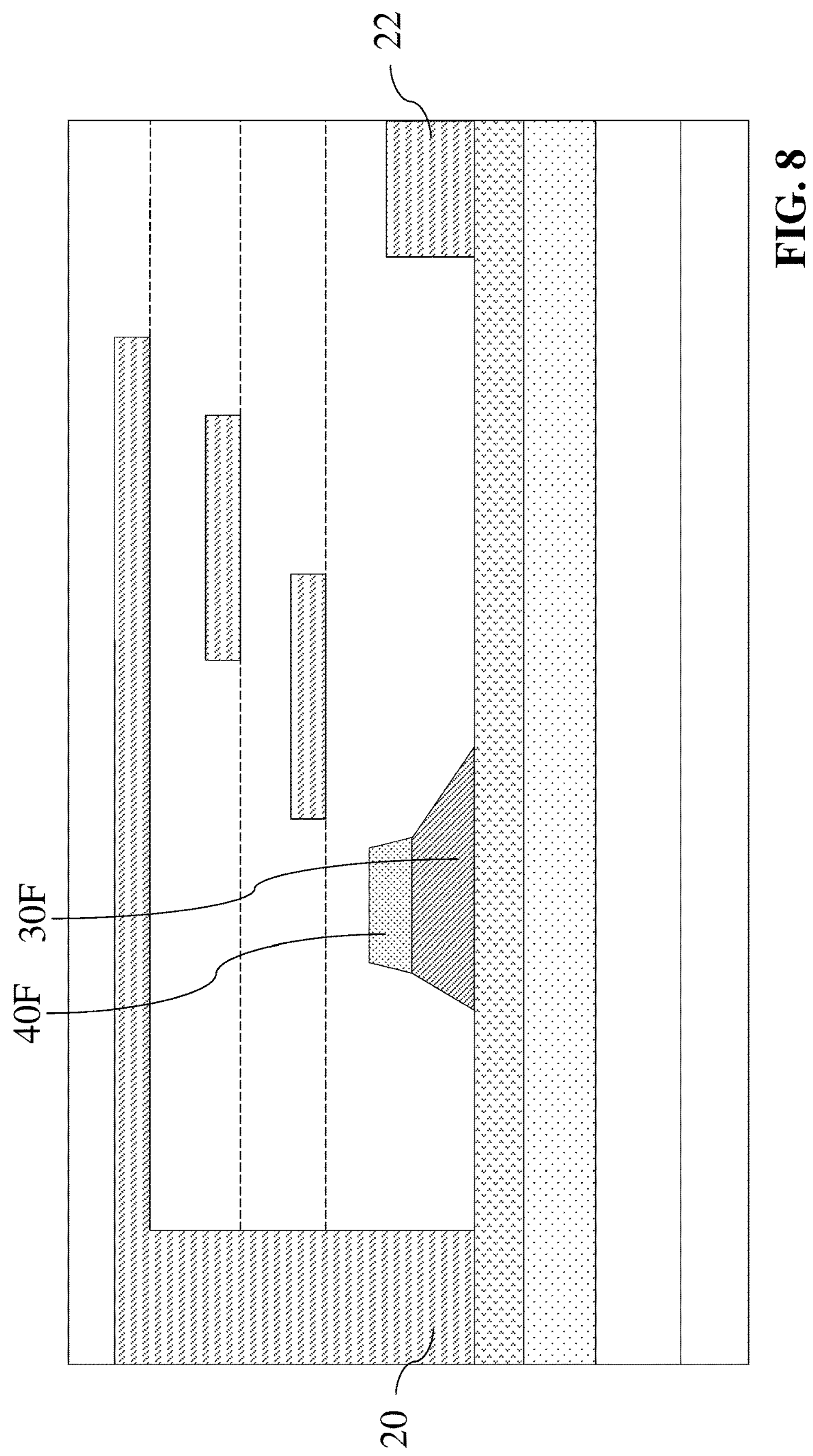
FIG. 8 is a vertical cross-sectional view of a semiconductor device according to some embodiments of the present disclosure.

FIG. 8 is a vertical cross-sectional view of a semiconductor device IF according to some embodiments of the present disclosure. The semiconductor device IF is similar to the semiconductor device 1E as described and illustrated with reference to FIG. 8, except that the p-type doped nitride-based semiconductor layer 30E and the gate electrode 40E in FIG. 6 are replaced by a doped nitride-based semiconductor layer 30F and a gate electrode 40F. The side surfaces of the doped nitride-based semiconductor layer 30F are asymmetrical about the gate electrode 40F. Specifically, the side surfaces of the doped nitride-based semiconductor layer 30F facing the electrodes 20 and 22 have different oblique angles, respectively.

Based on the above, in the embodiments of the present disclosure, the portion of the doped nitride-based semiconductor layer extends underneath the field plate, so both of them can modulate the electric field together, thereby achieving a better electrical distribution. Therefore, the breakdown can be suppressed. Moreover, the 2DEG concentration distribution can be controlled by the profile of the doped nitride-based semiconductor layer.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:

a first nitride-based semiconductor layer;

a second nitride-based semiconductor layer disposed on the first nitride-based semiconductor layer and having a bandgap higher than a bandgap of the first nitride-based semiconductor layer;

a source electrode and a drain electrode disposed above the second nitride-based semiconductor layer;

a gate electrode disposed above the second nitride-based semiconductor layer and between the source and drain electrodes;

a doped nitride-based semiconductor layer disposed between the second nitride-based semiconductor layer and the gate electrode; and a first field plate disposed over the doped nitride-based semiconductor layer, wherein a vertical projection of the doped nitride-based semiconductor layer on the second nitride-based semiconductor layer overlaps with a vertical projection of the first field plate on the second nitride-based semiconductor layer, and a vertical projection of the gate electrode on the second nitride-based semiconductor layer is physically separated from the vertical projection of the first field plate on the second nitride-based semiconductor layer, wherein a bottom of the doped nitride-based semiconductor layer comprises a main body portion, a first portion and a second portion, the main body portion overlaps with the gate electrode, the first portion and the second portion do not overlap with the gate electrode and continuously extend toward the source electrode and the drain electrode, respectively, from the main body portion, a first horizontal distance between a side of the gate electrode close to the drain electrode and a side of the second portion close to the drain electrode is greater than a second horizontal distance between a side of the gate electrode close to the source electrode and a side of the first portion close to the source electrode, and a thickness of at least one of the first portion and the second portion is less than a thickness of the main body portion.

2. The nitride-based semiconductor device of claim 1, wherein the bottom of the doped nitride-based semiconductor layer in contact with the second nitride-based semiconductor layer is wider than a bottom of the gate electrode in contact with the doped nitride-based semiconductor layer.

3. The nitride-based semiconductor device of claim 2, wherein the first field plate is positioned in a region between the gate electrode and the drain electrode and has an end portion directly located above the second portion of the bottom of the doped nitride-based semiconductor layer, and a vertical projection of the first field plate on the second nitride-based semiconductor layer is separated from a vertical projection of the drain electrode on the second nitride-based semiconductor layer.

4. The nitride-based semiconductor device of claim 2, wherein the second portion of the bottom of the doped nitride-based semiconductor layer extends toward the drain electrode and underneath the first field plate.

5. The nitride-based semiconductor device of claim 4, wherein the second portion of the doped nitride-based semiconductor layer has a thickness gradually decreasing along a direction toward the drain electrode.

6. The nitride-based semiconductor device of claim 4, wherein the first field plate has an extending length greater than an extending length of the second portion of the doped nitride-based semiconductor layer.

7. The nitride-based semiconductor device of claim 1, further comprising:

a second field plate disposed over the doped nitride-based semiconductor layer and the first field plate, wherein a vertical projection of the second field plate on the second nitride-based semiconductor layer is separated from the vertical projection of the doped nitride-based semiconductor layer on the second nitride-based semiconductor layer and overlaps with the vertical projection of the first field plate on the second nitride-based semiconductor layer, and the vertical projection of the second field plate on the second nitride-based semiconductor layer is separated from a vertical projection of the drain electrode on the second nitride-based semiconductor layer.

8. The nitride-based semiconductor device of claim 1, wherein positions of the source electrode and the drain electrode are asymmetrical about the gate electrode, and the first and second portions of the doped nitride-based semiconductor layer are asymmetrical about the gate electrode.

9. The nitride-based semiconductor device of claim 1, wherein the doped nitride-based semiconductor layer has at least one curved side surface.

10. The nitride-based semiconductor device of claim 1, wherein the doped nitride-based semiconductor layer has at least one surface shaped as a stepwise profile.

11. The nitride-based semiconductor device of claim 1, wherein the doped nitride-based semiconductor layer is shaped as being trapezoid, wherein the gate electrode is shaped as being trapezoid, and the trapezoid doped nitride-based semiconductor layer and the trapezoid gate electrode have side surfaces in different oblique angles, respectively.

12. The nitride-based semiconductor device of claim 11, wherein the trapezoid doped nitride-based semiconductor layer has a top width substantially the same as a bottom width of the trapezoid gate electrode.

13. The nitride-based semiconductor device of claim 1, wherein an entirety of the first field plate is in a position higher than the gate electrode.

14. The nitride-based semiconductor device of claim 1, wherein the gate electrode forms an interface with the doped nitride-based semiconductor layer therebetween, and the interface is vertically spaced apart from the first field plate.

15. The nitride-based semiconductor device of claim 7, further comprising a third field plate disposed over the second field plate, wherein the third field plate is electrically connected to the source electrode, and both the first field plate and the second field plate are electrically connected to the source electrode or electrically floated.

* * * * *